(12) United States Patent
Chao

(10) Patent No.: US 11,145,662 B2
(45) Date of Patent: Oct. 12, 2021

(54) MEMORY STRUCTURE

(71) Applicant: Powerchip Semiconductor Manufacturing Corporation, Hsinchu (TW)

(72) Inventor: Shun-Hao Chao, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/944,162

(22) Filed: Jul. 31, 2020

(65) Prior Publication Data

US 2020/0365600 A1    Nov. 19, 2020

Related U.S. Application Data

(62) Division of application No. 16/445,229, filed on Jun. 19, 2019, now Pat. No. 10,784,267.

(30) Foreign Application Priority Data

May 2, 2019 (TW) ................................. 108115229

(51) Int. Cl.
*H01L 27/11* (2006.01)
*H01L 29/78* (2006.01)
*H01L 49/02* (2006.01)

(52) U.S. Cl.
CPC .......... *H01L 27/1104* (2013.01); *H01L 28/40* (2013.01); *H01L 29/7833* (2013.01)

(58) Field of Classification Search
None
See application file for complete search history.

(56) References Cited

U.S. PATENT DOCUMENTS

| 2007/0057303 | A1* | 3/2007 | Su ........................ | H01L 27/1087 257/301 |
| 2007/0215937 | A1* | 9/2007 | Huang ................... | H01L 29/945 257/330 |
| 2009/0001481 | A1* | 1/2009 | Cannon ................ | H01L 27/1104 257/390 |
| 2009/0244954 | A1* | 10/2009 | Cannon ................ | H01L 27/1104 365/149 |
| 2011/0169065 | A1* | 7/2011 | Cheng ................ | H01L 29/66181 257/301 |

* cited by examiner

Primary Examiner — Khaja Ahmad
(74) Attorney, Agent, or Firm — JCIPRNET

(57) ABSTRACT

A memory structure including a substrate, a first transistor, a second transistor, and a trench capacitor is provided. The trench capacitor is disposed in the substrate and is connected between the first transistor and the second transistor.

9 Claims, 2 Drawing Sheets

MEMORY STRUCTURE

CROSS-REFERENCE TO RELATED APPLICATION

This application is a divisional application of and claims the priority benefit of U.S. application Ser. No. 16/445,229, filed on Jun. 19, 2019, now allowed, which claims the priority benefit of Taiwan application serial no. 108115229, filed on May 2, 2019. The entirety of each of the above-mentioned patent applications is hereby incorporated by reference herein and made a part of this specification.

BACKGROUND OF THE INVENTION

Field of the Invention

The invention relates to a semiconductor structure, and particularly relates to a memory structure.

Description of Related Art

A memory structure has been developed that includes a transistor and a capacitor coupled to each other. In this kind of memory structure, the capacitor is used as a storage device. Therefore, how to increase the capacitance of the capacitor to improve the electrical performance of the memory device is the current goal of the industry.

SUMMARY OF THE INVENTION

The invention provides a memory structure, which can effectively increase the capacitance of the capacitor, thereby improving the electrical performance of the memory device.

The invention provides a memory structure, which includes a substrate, a first transistor, a second transistor, and a trench capacitor. The trench capacitor is disposed in the substrate and is connected between the first transistor and the second transistor.

According to an embodiment of the invention, in the memory structure, the trench capacitor may be completely located in the substrate.

According to an embodiment of the invention, in the memory structure, the first transistor and the second transistor may be one and the other of a P-type metal oxide semiconductor (PMOS) transistor and an N-type metal oxide semiconductor (NMOS) transistor, respectively.

According to an embodiment of the invention, the memory structure may further include a capacitor. The capacitor is located above the trench capacitor and is electrically connected between the first transistor and the second transistor. The capacitor is connected in parallel with the trench capacitor.

According to an embodiment of the invention, in the memory structure, the substrate may have a trench. The trench capacitor may include a first electrode, a second electrode, a first dielectric layer, and a second dielectric layer. The first electrode is disposed in the trench. The second electrode is disposed in the trench and is located on the first electrode. The first dielectric layer is located between the first electrode and the substrate. The second dielectric layer is located between the second electrode and the first electrode and between the second electrode and the substrate.

According to an embodiment of the invention, in the memory structure, the first dielectric layer may not be present between the upper portion of the first electrode and the substrate.

According to an embodiment of the invention, the memory structure may further include a first doped region and a second doped region. The first doped region is located in the substrate on one side of the trench and is connected to the upper portion of the first electrode. The second doped region is located in the substrate on another side of the trench and is connected to the upper portion of the first electrode.

According to an embodiment of the invention, in the memory structure, the first transistor may include a first gate, a third doped region, and a fourth doped region. The first gate is disposed on the substrate and is insulated from the substrate. The third doped region and the fourth doped region are located in the substrate on two sides of the first gate. The fourth doped region is connected to the first doped region. The second transistor may include a second gate, a fifth doped region, and a sixth doped region. The second gate is disposed on the substrate and is insulated from the substrate. The fifth doped region and the sixth doped region are located in the substrate on two sides of the second gate. The fifth doped region is connected to the second doped region.

According to an embodiment of the invention, in the memory structure, the first transistor may further include a first well region. The first well region is located in the substrate. The third doped region and the fourth doped region are located in the first well region. The second transistor may further include a second well region. The second well region is located in the substrate. The fifth doped region and the sixth doped region are located in the second well region.

According to an embodiment of the invention, the memory structure may further include a capacitor. The capacitor is located above the trench capacitor. The capacitor may include a third electrode, a fourth electrode, and an insulating layer. The third electrode is electrically connected to the fourth doped region and the fifth doped region. The fourth electrode is disposed on the third electrode. The insulating layer is disposed between the third electrode and the fourth electrode.

According to an embodiment of the invention, in the memory structure, the first doped region and the fourth doped region may be different conductive types. The third electrode may be electrically connected to both of the first doped region and the fourth doped region.

According to an embodiment of the invention, in the memory structure, the substrate may have a trench. The trench capacitor may include a first electrode, a second electrode, and a dielectric structure. The first electrode is disposed in the substrate around the trench. The second electrode is disposed in the trench. The dielectric structure is located between the second electrode and the first electrode and between the second electrode and the substrate.

According to an embodiment of the invention, in the memory structure, the first electrode is, for example, a doped region.

According to an embodiment of the invention, in the memory structure, the dielectric structure may not be present between the upper portion of the second electrode and the substrate.

According to an embodiment of the invention, the memory structure may further include a first doped region and a second doped region. The first doped region is located in the substrate on one side of the trench and is connected to the upper portion of the second electrode. The second doped region is located in the substrate on another side of the trench and is connected to the upper portion of the second electrode.

According to an embodiment of the invention, in the memory structure, the first transistor may include a first gate, a third doped region, and a fourth doped region. The first gate is disposed on the substrate and is insulated from the substrate. The third doped region and the fourth doped region are located in the substrate on two sides of the first gate. The fourth doped region is connected to the first doped region. The second transistor may include a second gate, a fifth doped region, and a sixth doped region. The second gate is disposed on the substrate and is insulated from the substrate. The fifth doped region and the sixth doped region are located in the substrate on two sides of the second gate. The fifth doped region is connected to the second doped region.

According to an embodiment of the invention, in the memory structure, the first transistor may further include a first well region. The first well region is located in the substrate. The third doped region and the fourth doped region are located in the first well region. The second transistor may further include a second well region. The second well region is located in the substrate. The fifth doped region and the sixth doped region are located in the second well region.

According to an embodiment of the invention, the memory structure may further include a buried layer. The buried layer is electrically connected to the first electrode. The buried layer and the first well region may be separated from each other, and the buried layer and the second well region may be separated from each other.

According to an embodiment of the invention, the memory structure may further include a capacitor. The capacitor is located above the trench capacitor. The capacitor may include a third electrode, a fourth electrode, and an insulating layer. The third electrode is electrically connected to the fourth doped region and the fifth doped region. The fourth electrode is disposed on the third electrode. The insulating layer is disposed between the third electrode and the fourth electrode.

According to an embodiment of the invention, in the memory structure, the first doped region and the fourth doped region may be different conductive types. The third electrode may be electrically connected to both of the first doped region and the fourth doped region.

Based on the above description, in the memory structure according to the invention, since the trench capacitor connected between the first transistor and the second transistor is used as the capacitor of the memory, the memory structure can have a small size, and the capacitance of the capacitor can be effectively increased. Therefore, the electrical performance and the degree of integration of the memory device can be improved.

In order to make the aforementioned and other objects, features and advantages of the invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
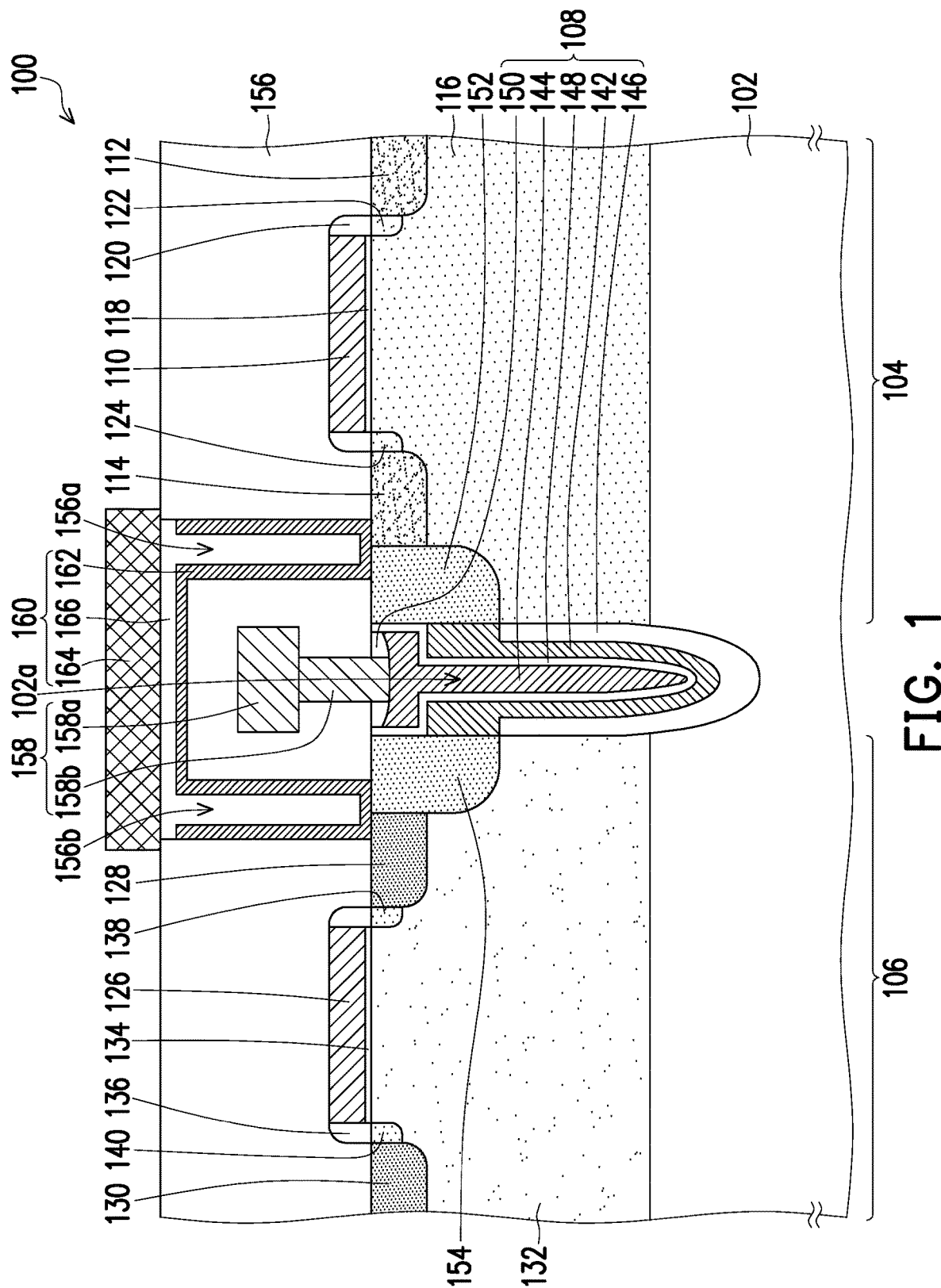
FIG. 1 is cross-sectional view illustrating a memory structure according to an embodiment of the invention.

FIG. 1 is cross-sectional view illustrating a memory structure according to an embodiment of the invention.

Referring to FIG. 1, the memory structure 100 includes a substrate 102, a transistor 104, a transistor 106, and a trench capacitor 108. The memory structure 100 is, for example, a two-transistor static random access memory (2T SRAM), but the invention is not limited thereto.

Hereinafter, the first conductive type and the second conductive type may be one and the other of the P-type conductive type and the N-type conductive type, respectively. In the present embodiment, the first conductive type is exemplified by the P-type conductive type, and the second conductive type is exemplified by the N-type conductive type, but the invention is not limited thereto. In another embodiment, the first conductive type may be the N-type conductive type, and the second conductive type may be the P-type conductive type.

The substrate 102 may have a trench 102a. The substrate 102 may be a semiconductor substrate such as a silicon substrate. In the present embodiment, the substrate 102 may have the first conductive type (e.g., P-type).

The transistor 104 and the transistor 106 may be one and the other of the PMOS transistor and the NMOS transistor, respectively. In the present embodiment, the transistor 104 may have the first conductive type (e.g., P-type), and the transistor 106 may have the second conductive type (e.g., N-type). In other words, the transistor 104 is exemplified by the PMOS transistor, and the transistor 106 is exemplified by the NMOS transistor, but the invention is not limited thereto.

The transistor 104 includes a gate 110, a doped region 112, and a doped region 114. The gate 110 is disposed on the substrate 102 and is insulated from the substrate 102. The material of gate 110 is, for example, doped polysilicon. The doped region 112 and the doped region 114 are located in the substrate 102 on two sides of the gate 110. The doped region 112 and the doped region 114 can serve as a source or a drain, respectively. The doped region 112 and the doped region 114 may have the first conductive type (e.g., P-type).

Furthermore, the transistor 104 may further include at least one of a well region 116, a dielectric layer 118, a spacer 120, a lightly doped drain (LDD) 122, and a LDD 124. The well region 116 is located in the substrate 102. The well region 116 may have the second conductive type (e.g., N-type). The doped region 112 and the doped region 114 are located in the well region 116. The dielectric layer 118 is disposed between the gate 110 and the substrate 102, whereby the gate 110 and the substrate 102 can be insulated from each other. The material of the dielectric layer 118 is, for example, silicon oxide. The spacer 120 is disposed on the sidewall of the gate 110. The spacer 120 may be a single-layer structure or a multilayer structure. The material of the spacer 120 is, for example, silicon oxide, silicon nitride, or a combination thereof.

The LDD 122 is located in the substrate 102 between the gate 110 and the doped region 112. The LDD 124 is located in the substrate 102 between the gate 110 and the doped region 114. Moreover, the LDD 122 and the LDD 124 may be located in the well region 116. The LDD 122 and the LDD 124 may have the first conductive type (e.g., P-type).

In some embodiments, "lightly doped drain (LDD)" may also be referred to as "source/drain extension (SDE)").

In addition, the transistor 104 may include other component known to those of ordinary skill in the art, such as a metal silicide layer (not shown) disposed on the gate 110, and the description thereof is omitted herein.

The transistor 106 may include a gate 126, a doped region 128, and a doped region 130. The gate 126 is disposed on substrate 102 and is insulated from substrate 102. The material of the gate 126 is, for example, doped polysilicon. The doped region 128 and the doped region 130 are located in the substrate 102 on two sides of the gate 126. The doped region 128 and the doped region 130 can serve as a source or a drain, respectively. The doped region 128 and the doped region 130 may have the second conductive type (e.g., N-type).

Furthermore, the transistor 106 may further include at least one of a well region 132, a dielectric layer 134, a spacer 136, a LDD 138, and a LDD 140. The well region 132 is located in the substrate 102. The well region 132 may have the first conductive type (e.g., P-type). The doped region 128 and the doped region 130 are located in the well region 132. The dielectric layer 134 is disposed between the gate 126 and the substrate 102, whereby the gate 126 and the substrate 102 can be insulated from each other. The material of the dielectric layer 134 is, for example, silicon oxide. The spacer 136 is disposed on the sidewall of the gate 126. The spacer 136 may be a single-layer structure or a multilayer structure. The material of spacer 136 is, for example, silicon oxide, silicon nitride, or a combination thereof.

The LDD 138 is located in the substrate 102 between the gate 126 and the doped region 128. The LDD 140 is located in the substrate 102 between the gate 126 and the doped region 130. Moreover, the LDD 138 and the LDD 140 may be located in the well region 132. The LDD 138 and the LDD 140 may have the second conductive type (e.g., N-type).

In addition, the transistor 106 may include other component known to those of ordinary skill in the art, such as a metal silicide layer (not shown) disposed on the gate 126, and the description thereof is omitted herein.

The trench capacitor 108 is disposed in the substrate 102 and is connected between the transistor 104 and the transistor 106. In the present embodiment, the trench capacitor 108 may be completely located in the substrate 102.

The trench capacitor 108 may include an electrode 142, an electrode 144, a dielectric layer 146, and a dielectric layer 148. The trench capacitor 108 may further include a dielectric layer 150. The electrode 142 is disposed in the trench 102a. The material of the electrode 142 is, for example, doped polysilicon, and the doped polysilicon may have the second conductive type (e.g., N-type). The electrode 144 is disposed in the trench 102a and is located on the electrode 142. The material of electrode 144 is, for example, doped polysilicon. The dielectric layer 146 is located between the electrode 142 and the substrate 102. The dielectric layer 146 may not be present between the upper portion of the electrode 142 and the substrate 102. The material of the dielectric layer 146 is, for example, silicon oxide. The dielectric layer 148 is located between the electrode 144 and the electrode 142 and between the electrode 144 and the substrate 102. The material of the dielectric layer 148 is, for example, silicon oxide, silicon nitride, silicon oxide/silicon nitride/silicon oxide (ONO), silicon nitride/silicon oxide (NO), or a combination thereof. The dielectric layer 150 is disposed on the electrode 144. The material of the dielectric layer 150 is, for example, silicon oxide.

The memory structure 100 may further include a doped region 152 and a doped region 154. The doped region 152 is located in the substrate 102 on one side of the trench 102a and is connected to the upper portion of the electrode 142. The doped region 114 is connected to the doped region 152. The doped region 154 is located in the substrate 102 on another side of the trench 102a and is connected to the upper portion of the electrode 142. The doped region 128 is connected to the doped region 154. The doped region 152 and the doped region 154 may respectively have the second conductive type (e.g., N-type). In addition, the doped region 152 and the doped region 114 may be different conductive types.

Furthermore, the memory structure 100 may further include at least one of a dielectric layer 156, an interconnect structure 158, and a capacitor 160. The dielectric layer 156 may have an opening 156a and an opening 156b. The dielectric layer 156 covers the transistor 104, the transistor 106, and the trench capacitor 108. The dielectric layer 156 may be a single-layer structure or a multilayer structure. The material of the dielectric layer 156 may be silicon oxide, silicon nitride, or a combination thereof.

The interconnect structure 158 is disposed in the dielectric layer 156 and is electrically connected to the electrode 144. The interconnect structure 158 may include a conductive layer 158a and a contact 158b. The contact 158b is electrically connected between the conductive layer 158a and the electrode 144. The material of conductive layer 158a is, for example, copper, aluminum, tungsten, or a combination thereof. The material of contact 158b is, for example, tungsten.

The capacitor 160 is located above the trench capacitor 108 and is electrically connected between the transistor 104 and the transistor 106. The capacitor 160 is connected in parallel with the trench capacitor 108, whereby the capacitance can be further increased.

In the present embodiment, the capacitor 160 may include an electrode 162, an electrode 164, and an insulating layer 166, but the invention is not limited thereto. The electrode 162 may be conformally disposed in the opening 156a and the opening 156b. The electrode 162 may be extended between the opening 156a and the opening 156b. The electrode 162 is electrically connected to the doped region 114 and the doped region 128. The electrode 162 may be electrically connected to both of the doped region 152 and the doped region 114. In addition, the electrode 162 may be electrically connected to both of the doped region 154 and the doped region 128. The electrode 164 is disposed on the electrode 162. The material of electrode 162 and electrode 164 is, for example, Ti, TiN, Ta, TaN, Al, In, Nb, Hf, Sn, Zn, Zr, Cu, Y, W, Pt, or a combination thereof. The insulating layer 166 is disposed between the electrode 162 and the electrode 164. In addition, the insulating layer 166 may be filled in the opening 156a and the opening 156b. The material of the insulating layer 166 is, for example, a high dielectric constant (high-k) material, silicon oxide, silicon nitride, silicon oxide/silicon nitride/silicon oxide (ONO), or a combination thereof. The high-k material is, for example, tantalum oxide ($Ta_2O_5$), aluminum oxide ($Al_2O_3$), hafnium oxide ($HfO_2$), titanium oxide ($TiO_2$), zirconium oxide ($ZrO_2$), or a combination thereof. In the capacitor 160, since the insulating layer 166 is disposed between the electrode 162 and the electrode 164, a metal-insulator-metal (MIM) capacitor can be formed.

In some embodiments, the metal silicide (not shown) may be formed between the electrode 162 and the doped region 152, between the electrode 162 and the doped region 114, between the electrode 162 and the doped region 154, and between the electrode 162 and the doped region 128, respectively.

In the present embodiment, the memory structure 100 includes both of the trench capacitor 108 and the capacitor 160, but the invention is not limited thereto. As long as the memory structure 100 includes the trench capacitor 108, it is within the scope of the invention.

In some embodiments, the memory structure 100 may not include the capacitor 160. In this case, a contact (not shown) may be electrically connected to both of the doped region 152 and the doped region 114, and another contact (not shown) may be electrically connected to both of the doped region 154 and the doped region 128.

Moreover, the memory structure 100 may further include other component known to those of ordinary skill in the art, such as an interconnect structure (not shown) electrically connected to the doped region 112 and an interconnect structure (not shown) electrically connected to the doped region 130, and the description thereof is omitted herein.

Based on the above embodiment, in the memory structure 100, since the trench capacitor 108 connected between the transistor 104 and the transistor 106 is used as the capacitor of the memory, the memory structure 100 can have a small size, and the capacitance of the capacitor can be effectively increased. Therefore, the electrical performance and the degree of integration of the memory device can be improved.

Figure 2:
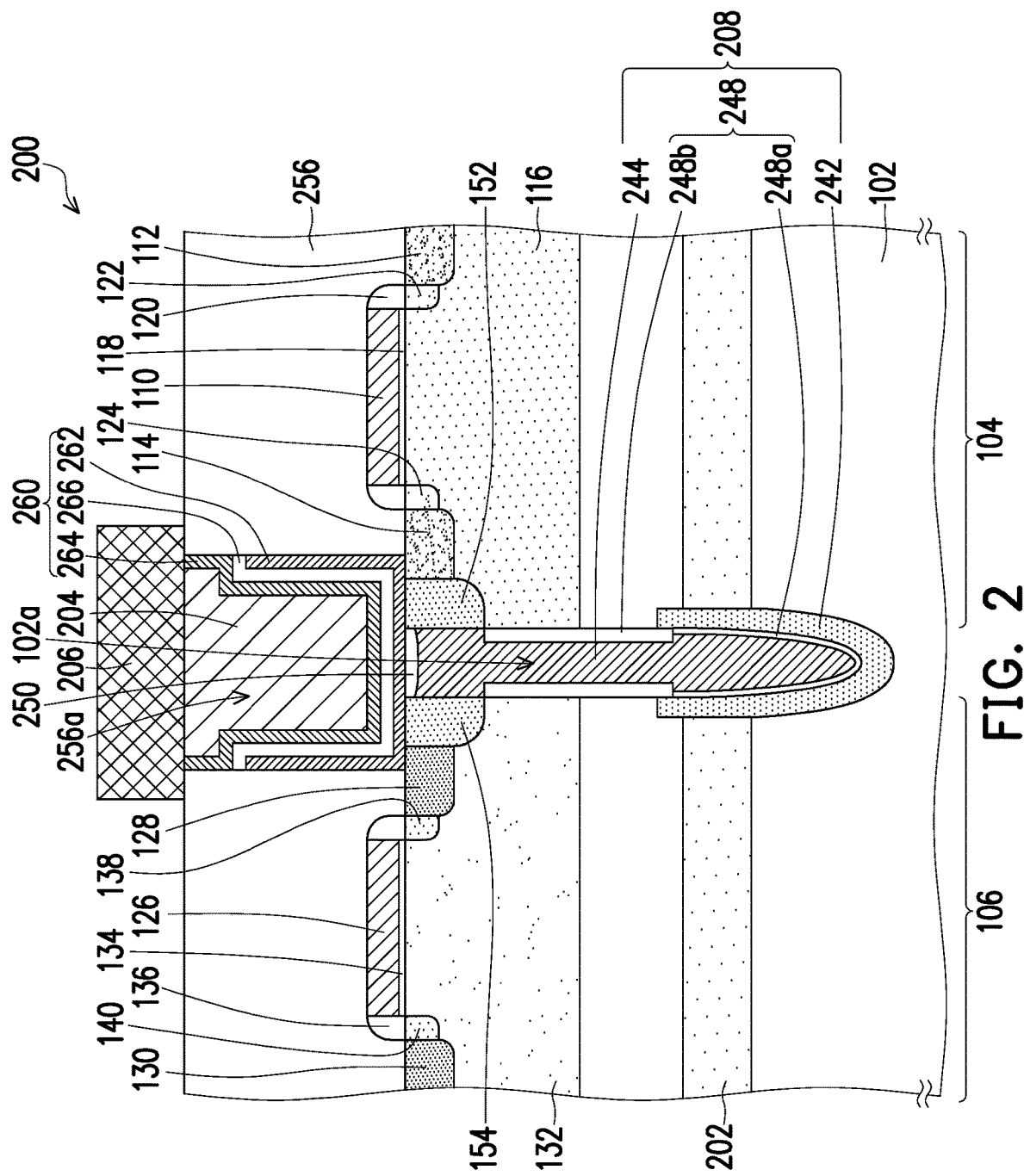
FIG. 2 is cross-sectional view illustrating a memory structure according to another embodiment of the invention.

FIG. 2 is cross-sectional view illustrating a memory structure according to another embodiment of the invention.

Referring to FIG. 1 and FIG. 2, the difference between the memory structure 200 of FIG. 2 and the memory structure 100 of FIG. 1 is as follows. The trench capacitor 208 may include an electrode 242, an electrode 244, and a dielectric structure 248. The electrode 242 is disposed in the substrate 102 around the trench 102a. The electrode 242 is, for example, a doped region. In the present embodiment, the electrode 242 may be the doped region of the second conductive type (e.g., N-type). The electrode 244 is disposed in the trench 102a. The electrode 244 may be a single-layer structure or a multilayer structure. The material of the electrode 244 is, for example, doped polysilicon, and the doped polysilicon may have the second conductive type (e.g., N-type). The dielectric structure 248 is located between the electrode 244 and the electrode 242 and between the electrode 244 and the substrate 102. The dielectric structure 248 may be a single-layer structure or a multilayer structure. In the present embodiment, the dielectric structure 248 is exemplified by the multilayer structure. For example, the dielectric structure 248 may include a dielectric layer 248a and a dielectric layer 248b. The dielectric layer 248a is located between the electrode 244 and the electrode 242. The dielectric layer 248b is located between the electrode 244 and the substrate 102. The dielectric structure 248 may not be present between the upper portion of the electrode 244 and the substrate 102. The doped region 152 is connected to the upper portion of the electrode 244. The doped region 154 is connected to the upper portion of the electrode 244. The dielectric layer 250 is disposed on the electrode 244.

The memory structure 200 may further include a buried layer 202. The buried layer 202 is electrically connected to the electrode 242. The buried layer 202 and the well region 116 may be separated from each other, and the buried layer 202 and the well region 132 may be separated from each other.

The capacitor 260 is located above the trench capacitor 208 and is electrically connected between the transistor 104 and the transistor 106. The capacitor 260 is connected in parallel with the trench capacitor 208, whereby the capacitance can be further increased. The capacitor 260 may include an electrode 262, an electrode 264, and an insulating layer 266, but the invention is not limited thereto. The electrode 262 may be conformally disposed in the opening 256a of the dielectric layer 256. The electrode 262 is electrically connected to the doped region 114 and the doped region 128. The electrode 262 may be electrically connected to both of the doped region 152 and the doped region 114. In addition, the electrode 262 may also be electrically connected to both of the doped region 154 and the doped region 128. The electrode 264 is disposed on the electrode 262. The insulating layer 266 is disposed between the electrode 262 and the electrode 264, thereby forming a metal-insulator-metal (MIM) capacitor. In some embodiments, the metal silicide (not shown) may be formed between the electrode 262 and the doped region 152, between the electrode 262 and the doped region 114, between the electrode 262 and the doped region 154, and between the electrode 262 and the doped region 128, respectively.

The memory structure 200 may further include a conductive layer 204 and a conductive layer 206. The conductive layer 204 is filled in the opening 256a and is electrically connected to the electrode 264. The material of the conductive layer 204 is, for example, tungsten. The conductive layer 206 is disposed on the conductive layer 204 and is electrically connected to the conductive layer 204 and the electrode 264. The material of the conductive layer 206 is, for example, copper, aluminum, tungsten, or a combination thereof. Furthermore, the memory structure 200 may not include the interconnect structure 158 in the memory structure 100.

In some embodiments, the memory structure 200 may not include the capacitor 260. In this case, a contact (not shown) may be electrically connected to both of the doped region 152 and the doped region 114, and another contact (not shown) may be electrically connected to both of the doped region 154 and the doped region 128.

Moreover, in the memory structure 200 and the memory structure 100, the same or similar components are denoted by the same or similar reference numerals, and the description thereof is omitted.

Based on the above embodiment, in the memory structure 200, since the trench capacitor 208 connected between the transistor 104 and the transistor 106 is used as the capacitor of the memory, the memory structure 200 can have a small size, and the capacitance of the capacitor can be effectively increased. Therefore, the electrical performance and the degree of integration of the memory device can be improved.

In summary, in the memory structure of the aforementioned embodiments, since the trench capacitor is used as the capacitor of the memory, the electrical performance and the degree of integration of the memory device can be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory structure, comprising:
    a substrate;
    a first transistor and a second transistor;
    a trench capacitor disposed in the substrate and connected between the first transistor and the second transistor, wherein the substrate has a trench, and the trench capacitor comprises:
        a first electrode disposed in the substrate around the trench;
        a second electrode disposed in the trench; and
        a dielectric structure located between the second electrode and the first electrode and between the second electrode and the substrate, wherein the dielectric structure is not present between an upper portion of the second electrode and the substrate;
    a first doped region located in the substrate on one side of the trench and connected to the upper portion of the second electrode; and
    a second doped region located in the substrate on another side of the trench and connected to the upper portion of the second electrode, wherein
    the first transistor comprises:
        a first gate disposed on the substrate and insulated from the substrate; and
        a third doped region and a fourth doped region located in the substrate on two sides of the first gate, wherein the fourth doped region is connected to the first doped region, and
    the second transistor comprises:
        a second gate disposed on the substrate and insulated from the substrate; and
        a fifth doped region and a sixth doped region located in the substrate on two sides of the second gate, wherein the fifth doped region is connected to the second doped region.

2. The memory structure according to claim 1, wherein the trench capacitor is completely located in the substrate.

3. The memory structure according to claim 1, wherein the first transistor and the second transistor are one and the other of a P-type metal oxide semiconductor transistor and an N-type metal oxide semiconductor transistor, respectively.

4. The memory structure according to claim 1, further comprising:
    a capacitor located above the trench capacitor and electrically connected between the first transistor and the second transistor, wherein the capacitor is connected in parallel with the trench capacitor.

5. The memory structure according to claim 1, wherein the first electrode comprises a doped region.

6. The memory structure according to claim 1, wherein the first transistor further comprises:
    a first well region located in the substrate, wherein the third doped region and the fourth doped region are located in the first well region, and
    the second transistor further comprises:
        a second well region located in the substrate, wherein the fifth doped region and the sixth doped region are located in the second well region.

7. The memory structure according to claim 6, further comprising:
    a buried layer electrically connected to the first electrode, wherein the buried layer and the first well region are separated from each other, and the buried layer and the second well region are separated from each other.

8. The memory structure according to claim 1, further comprising:
    a capacitor located above the trench capacitor and comprising:
        a third electrode electrically connected to the fourth doped region and the fifth doped region;
        a fourth electrode disposed on the third electrode; and
        an insulating layer disposed between the third electrode and the fourth electrode.

9. The memory structure according to claim 8, wherein the first doped region and the fourth doped region are different conductive types, and the third electrode is electrically connected to both of the first doped region and the fourth doped region.

* * * * *